(12) United States Patent
Tanakamaru et al.

(10) Patent No.: US 11,133,831 B2
(45) Date of Patent: Sep. 28, 2021

(54) CODE RATE ADAPTATION

(71) Applicant: Seagate Technology LLC, Cupertino, CA (US)

(72) Inventors: Shuhei Tanakamaru, San Jose, CA (US); Scott McClure, Sudbury (CA); Erich Franz Haratsch, San Jose, CA (US)

(73) Assignee: SEAGATE TECHNOLOGY LLC, Fremont, CA (US)

( * ) Notice: Subject to any disclaimer, the term of this patent is extended or adjusted under 35 U.S.C. 154(b) by 0 days.

(21) Appl. No.: 16/667,491

(22) Filed: Oct. 29, 2019

(65) Prior Publication Data
US 2021/0126657 A1 Apr. 29, 2021

(51) Int. Cl.
*G11C 29/00* (2006.01)
*H03M 13/35* (2006.01)
*G06F 11/10* (2006.01)

(52) U.S. Cl.
CPC ....... *H03M 13/353* (2013.01); *G06F 11/1076* (2013.01)

(58) Field of Classification Search
None
See application file for complete search history.

(56) References Cited

U.S. PATENT DOCUMENTS

| | | | |
|---|---|---|---|
| 8,255,772 B1 | 8/2012 | Foley | |
| 8,719,531 B2 | 5/2014 | Strange et al. | |
| 8,762,798 B2 | 6/2014 | Hu et al. | |
| 8,996,961 B2 | 3/2015 | Chen et al. | |
| 9,201,728 B2 | 12/2015 | Patapoutian et al. | |
| 9,419,655 B2 | 8/2016 | Cai et al. | |
| 9,425,829 B2 | 8/2016 | Ramaraju et al. | |
| 9,495,232 B2 | 11/2016 | Gjorup | |
| 9,698,935 B2 | 7/2017 | Linstadt | |
| 9,727,416 B2 | 8/2017 | Dick | |
| 9,917,674 B2 | 3/2018 | Soong et al. | |
| 10,101,931 B1 | 10/2018 | Camp et al. | |
| 2010/0088557 A1 | 4/2010 | Weingarten et al. | |
| 2012/0324191 A1 | 12/2012 | Strange et al. | |
| 2013/0061115 A1* | 3/2013 | Imai | H03M 13/618 714/763 |
| 2013/0246878 A1* | 9/2013 | Pancholi | H03M 7/4031 714/752 |
| 2013/0275818 A1* | 10/2013 | Okubo | G06F 11/1048 714/54 |
| 2018/0067666 A1* | 3/2018 | d'Abreu | G06F 3/0619 |
| 2018/0342305 A1 | 11/2018 | Cha et al. | |

(Continued)

OTHER PUBLICATIONS

Non-Final Rejection for U.S. Appl. No. 16/683,742, dated Jan. 14, 2021, 13 pages.

(Continued)

*Primary Examiner* — Guerrier Merant
(74) *Attorney, Agent, or Firm* — Westman, Champlin & Koehler, P.A.

(57) ABSTRACT

A method includes programming data in a block of a storage device, and reading back the programmed data and determining a maximum error count for the block. A code rate index that satisfies correction of the maximum error count for the block is determined. A current code rate index is adjusted to the code rate index that satisfies correction of the maximum error count for the block.

20 Claims, 4 Drawing Sheets

(56) References Cited

U.S. PATENT DOCUMENTS

2019/0107959 A1* 4/2019 Papandreou .......... G06F 3/0619
2019/0286516 A1* 9/2019 Jacobvitz ............ G11C 11/5642

OTHER PUBLICATIONS

Applicant-Initiated Interview Summary for U.S. Appl. No. 16/683,742, dated Mar. 8, 2021, 2 pages.
Final Rejection for U.S. Appl. No. 16/683,742, dated May 19, 2021, 10 pages.

* cited by examiner

| Index, $i$ | Correctable bit ($t$) | MaxErr Threshold ($T(i)$) |
|---|---|---|
| 0 | 80 | 40 |
| 1 | 100 | 50 |
| 2 | 140 | 70 |
| 3 | 180 | 90 |
| 4 | 250 | 125 |
| 5 | 300 | 150 |

CODE RATE ADAPTATION

SUMMARY

In one embodiment, a method includes programming data in a block of a storage device, and reading back the programmed data and determining a maximum error count for the block. A code rate index that satisfies correction of the maximum error count for the block is determined. A current code rate index is adjusted to the code rate index that satisfies correction of the maximum error count for the block.

In another embodiment, an apparatus includes an error correction code element configured to encode and decode data using any of a plurality of error correction codes (ECCs) of different code rates, and to determine a fail-bit count of an ECC codeword within a block of a storage device of the apparatus. An ECC selection element is configured to control selection of an ECC of the plurality of ECCs that has a weakest ECC that is sufficient to correct the determined fail-bit count.

In another embodiment, an apparatus includes a controller, a storage device coupled to the controller, and a code rate adaptation module configured to adjust error correction for the storage device. The controller is configured to program data in a block of a storage device, and to read back the programmed data and obtain a maximum error count for the block. The code rate adaptation module is configured to determine a code rate index that satisfies correction of the maximum error count for the block, and to adjust a current code rate index to the code rate index that satisfies correction of the maximum error count for the block.

This summary is not intended to describe each disclosed embodiment or every implementation of code rate adaptation in a data storage device as described herein. Many other novel advantages, features, and relationships will become apparent as this description proceeds. The figures and the description that follow more particularly exemplify illustrative embodiments.

DETAILED DESCRIPTION OF ILLUSTRATIVE EMBODIMENTS

Figure 1:
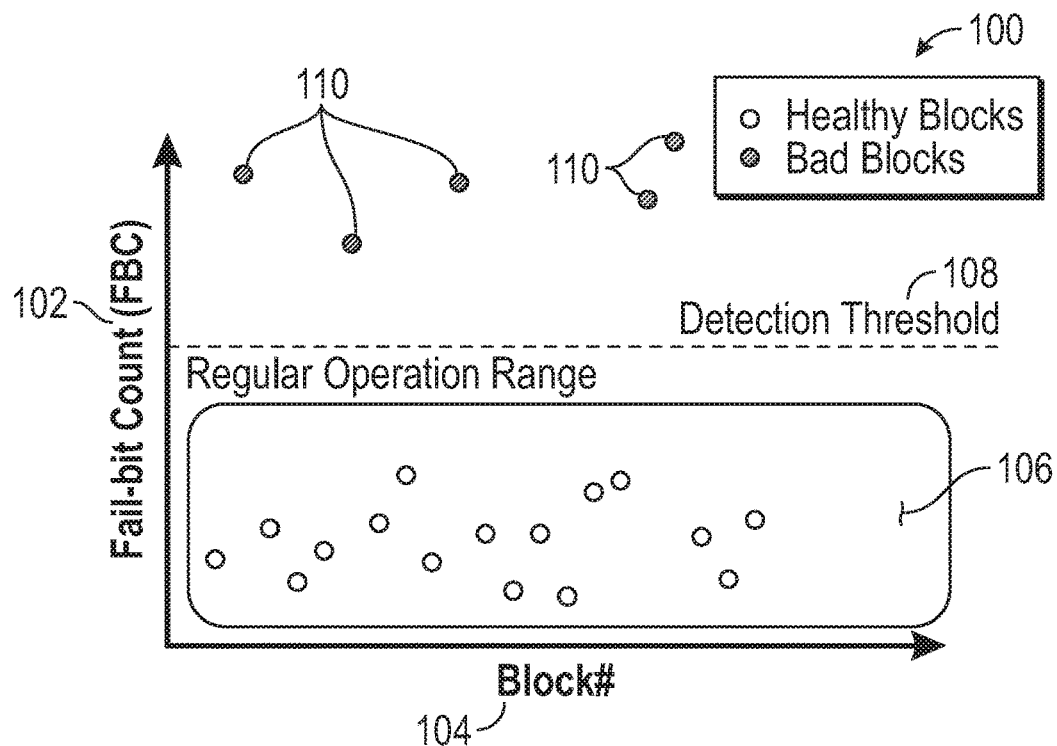
FIG. 1 is a graph of fail-bit counts by block in a representative storage device.

Embodiments of the present disclosure address the above-noted disadvantages with strengthening ECC without the ability to later weaken ECC, and adjusting ECC levels by a single level instead of more than one level. They do so by allowing bi-directional adjustment (increasing or decreasing) of ECC strength to a strong or weak ECC level even if that level is more than a single level form the current level, in one embodiment by maintaining a correction margin. Embodiments of the present disclosure provide better utilization of the storage space and possible enhancements in performance.

In one embodiment of the present disclosure, a maximum fail-bit count of an ECC codeword within a block is used as an adaptation trigger. The trigger metric may be a total number of errors corrected of the ECC codeword, or an estimated bit error count from a syndrome weight of the ECC decoder. Then, the fail-bit count statistics are compared against a threshold value which ensures reliability margin. The ECC that is the weakest but will still satisfy the threshold comparison is selected. This may be bi-directional, to a stronger or a weaker ECC than the current ECC, and is not limited to a single level adjustment.

Adaptive ECC schemes in which the ECC is gradually strengthened to cope with wear to a storage device do not allow for weakening ECC after a strengthening. Further, most ECC adaptations, when they strengthen the ECC (lower the code rate), increment by a single level of ECC strength. This may result in multiple incremental adjustments to the code rate before a proper ECC level is reached.

In storage devices that use an adaptive ECC scheme, such as but not limited to flash memory, solid state drives, and the like, the storage device can exhibit abnormally high fail-bit counts that can lead to a catastrophic performance degradation and/or data loss. Adaptive ECC schemes in which the ECC is gradually strengthened to cope with the wear have limited functionality as discussed herein. Because of the limited functionality of such schemes, as discussed above, embodiments of the present disclosure may be employed to improve ECC adaptation for better detection and mitigation.

It should be noted that the same reference numerals are used in different figures for same or similar elements. It should also be understood that the terminology used herein is for the purpose of describing embodiments, and the terminology is not intended to be limiting. Unless indicated otherwise, ordinal numbers (e.g., first, second, third, etc.) are used to distinguish or identify different elements or steps in a group of elements or steps, and do not supply a serial or numerical limitation on the elements or steps of the embodiments thereof. For example, "first," "second," and "third" elements or steps need not necessarily appear in that order, and the embodiments thereof need not necessarily be limited to three elements or steps. It should also be understood that, unless indicated otherwise, any labels such as "left," "right," "front," "back," "top," "bottom," "forward," "reverse," "clockwise," "counter clockwise," "up," "down," or other similar terms such as "upper," "lower," "aft," "fore," "vertical," "horizontal," "proximal," "distal," "intermediate" and the like are used for convenience and are not intended to imply, for example, any particular fixed location, orientation, or direction. Instead, such labels are used to reflect, for example, relative location, orientation, or directions. It should also be understood that the singular forms of "a," "an," and "the" include plural references unless the context clearly dictates otherwise.

FIG. 1 shows a graph 100 of fail-bit counts (axis 102) by block (axis 104) in a representative storage device. Typical operation of healthy blocks produces fail-bit counts in a regular operating range 106. When a fail-bit count for a block is in the regular operating range, ECC adaptation is not typically performed. Some blocks 110 in graph 100, however, show fail-bit counts that are above a detection threshold 108. Those blocks 110 have fail-bit counts that are outside of a regular operating range are candidates for ECC adaptation according to embodiments of the present disclosure. Those blocks that have fail-bit counts that do not meet the detection threshold are not subject to code rate adaptation unless they later have fail-bit counts that meet the detection threshold.

Figure 2:
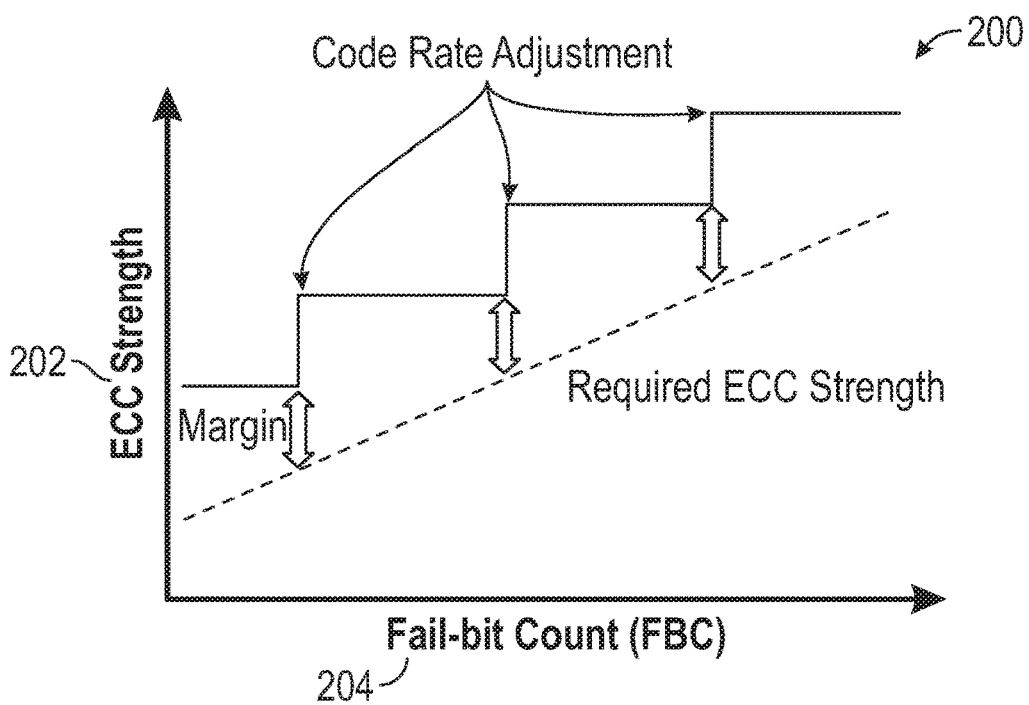
FIG. 2 is a graph showing ECC strength, as a function of fail-bit count, and operation in code rate adjustment, in a representative storage device.

ECC strength, as a function of fail-bit count, and operation in an embodiment of code rate adjustment, is shown in graphical form in FIG. 2. When a high fail-bit count, such as a fail-bit count above a threshold detection level 108 as shown in FIG. 1, is detected, ECC strength may be adjusted to correct the number of errors. A stronger ECC allows for the correction of more errors, at the expense of more space being used for ECC. A correction margin is often used in adjusting ECC strength. For example, once a fail-bit count reaches a certain level as it relates to an amount of correctable errors, that is, within a margin, the ECC strength may be adjusted. Referring to FIG. 2, a graph 200 showing ECC strength (on axis 202) versus fail-bit count (on axis 204) is shown. As fail-bit count rises, strength of ECC is occasionally adjusted upward in traditional code rate adjustment schemes, maintaining a margin. Code rate adjustment in traditional schemes is only adjusted upward to a stronger ECC level. Once that stronger ECC level is used, the ECC strength remains at that level or moves higher, once level of ECC strength at a time.

In embodiments of the present disclosure, additional flexibility regarding code rate adjustment allows for different detection schemes, as well as for adjustment to stronger or weaker ECC, as well as multiple level adjustment of ECC strength, that is, more than a single ECC level adjustment at a time. With the choosing of a correct ECC strength, including stronger or weaker, or remotely stronger or weaker (e.g., more than an incremental change to the code rate index up or down), better utilization of storage space and further enhancements are possible.

Code rate adaptation to increase or decrease the strength of ECC based on criteria is provided in embodiments of the disclosure. This adaptation increase or decrease can be by more than one level of strength, according to a table such as, but not limited to, the example table of FIG. 3. Such adaptation may be done based on fail-bit count, or whatever criteria may be used to determine whether the appropriate ECC strength is present.

In embodiments of the present disclosure, when a code rate test is performed and adjustment to a different ECC level is determined to be appropriate, adjustment may be made. Referring to the table 300 shown in FIG. 3, there is a code rate index table pairing a code rate index i (302) with a number of correctable bit errors t (304). When the number of bit errors in a block exceeds the t for the current i, then the index is adjusted up. When the number of bit errors in a block is less than the t for the current i, and a smaller i is capable of correcting the number of errors t, the index is adjusted down. A selectable margin 306 may be used to allow leeway in ECC levels to account for an inexact or slightly changing bit fail count. As shown in the table 300, a 50% margin is chosen (306). Using a 50% margin, a maximum error threshold T(i) 308 is determined using the margin choice and the correctable bit count t. In the table 300, with a 50% margin, the maximum error threshold for a level is half (50%) of the correctable bit count t for the index i. Other margins may be chosen without departing from the scope of the disclosure. Further, the margin may be different for each code rate index i, for example, 50% for index 0, 10 bits for index 1, etc., instead of a set percentage for all indices.

When a code rate test is performed, the code rate test scheme collects statistics such as but not limited to retry counts, total clock cycles of the low density parity check (LDPC) decoder, etc. This is done in one embodiment immediately after programming the block, and is used to decide whether to strengthen or weaken the ECC, or not. In embodiments of the disclosure, during the collection of the statistics, fail-bit count statistics are also collected. This collection of statistics including fail-bit count statistics, allows for operation of embodiments of the present disclosure.

One metric for determining a fail-bit count according to an embodiment of the disclosure is the maximum fail-bit count of an ECC codeword within a block. This may be referred to as maximum error. The fail-bit count statistics are compared against a threshold value which ensures a predetermined reliability margin, as discussed above. The ECC code rate that is the weakest but still satisfy the threshold comparison is selected.

To obtain the maximum error count, a maximum of all the bit error counts of all the ECC codewords within a block is reported, or may be estimated from syndrome weight. Syndrome weight may be used when the ECC fails, to estimate a number of bit errors. Syndrome weight may be used by counting each ECC equation used as a pass or a fail. ECC equations are the evaluated determinations that are used to decide if errors are present. The results of the ECC equations used in the ECC code are a syndrome. Totaling the number of non-zero symbols in the syndrome equates to syndrome weight, allowing an estimation of bit error count even with a read failure. Use of syndrome weight as a method to obtain fail-bit counts adds further flexibility in code rate adaptation.

SSDs contain internal memory, for example, in the controller, in a dedicated memory, or within the NAND flash. The internal SSD memory holds data to be programmed. In another embodiment, this data is retained after programming, such as by reading the data back from the flash, data comparison can be performed between the actual written data and the data that was in the internal memory prior to it being written. Therefore, in another embodiment, bit error counts are obtained by reading the raw data (without ECC decoding) from the NAND flash and comparing the raw data with the remaining data in the write buffer of the SSD. This does not rely on ECC decoding, but provides a bit error determination.

The code rate index is chosen as described above, to set the ECC strength at the weakest code that corrects all the errors within the margin. The embodiments of the present disclosure allow movement of the code rate to a proper code rate, stronger or weaker, and may skip indices up or down.

Figures 3, 4:
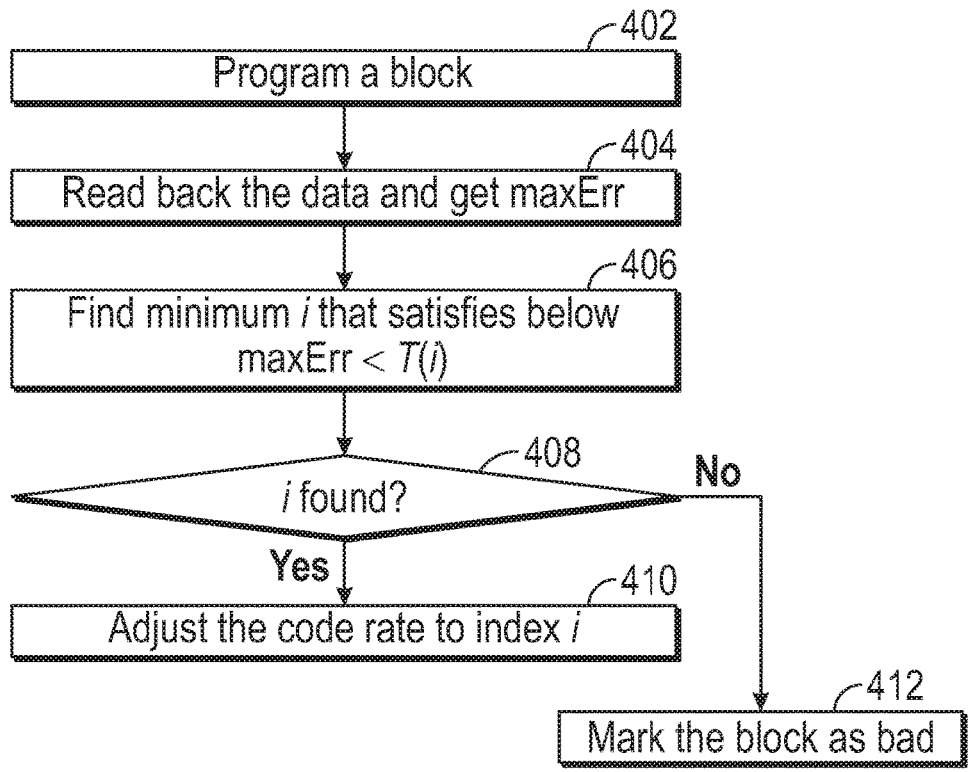
FIG. 3 is a code rate table according to an embodiment of the present disclosure.
FIG. 4 is a flow diagram of a method according to an embodiment of the present disclosure.

A method 400 according to an embodiment of the present disclosure is shown in flow chart form in FIG. 4. Method 400 comprises programming data in block 402, reading back data and obtaining a maximum error count in block 404. Then, with that information, a code rate index that satisfies correction of the number of errors determined is obtained in block 406. This is accomplished for example using the table 300 of FIG. 3 to select an appropriate code rate index i, regardless of what the current code rate index i is. If a code rate index suitable for correcting bits at the maximum error threshold 308 is found in block 408, then the code rate is adjusted to the found code rate in block 410. If the error count exceeds a highest number of correctable errors in the table 300, the block is marked as bad in block 412.

In block 406, the minimum code rate (weakest ECC) that satisfies correction of the maximum error count is selected. As has been discussed, the code rate may be adjusted up or down, and by more than one level. Maximum error count may be determined in various ways without departing from the scope of the disclosure. For example, maximum error may be the maximum fail-bit count of the ECC codewords in the block. Maximum error may also be inferred from the syndrome weight when decoding is not successful.

While maximum error has been described and shown as the metric to compare against the threshold, it should be understood that additional or different fail-bit count metrics may be used without departing from the scope of the disclosure. For example, average maximum error for multiple blocks, or for all blocks written, could be used.

Figure 5:
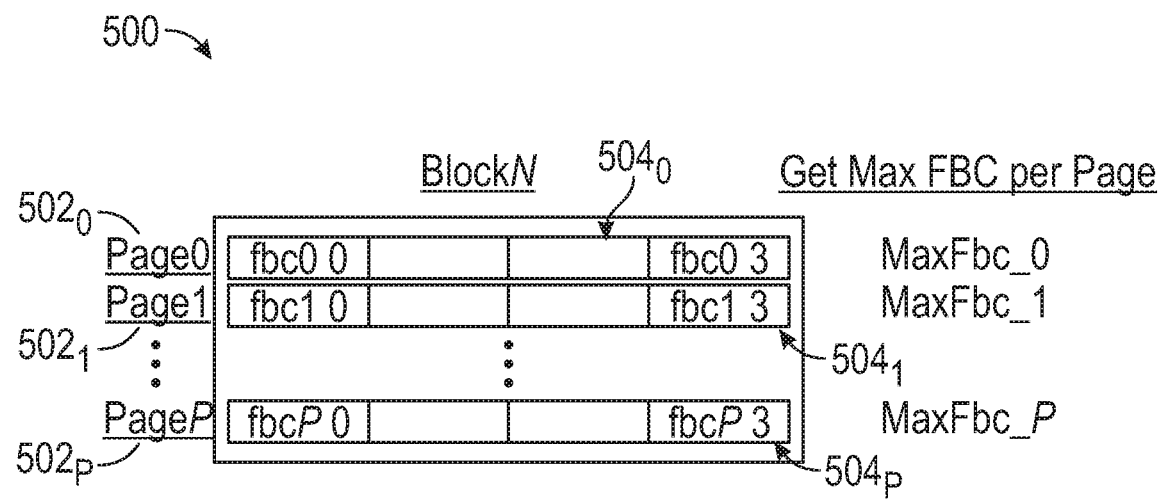
FIG. 5 is a block diagram of a block of a storage device according to another embodiment of the present disclosure.

FIG. 5 shows a representative block 500 of a data storage device. Block 500 has pages $502_0$, $502_1$, ..., $502_P$, each in this example having four codewords $504_0$, $504_1$, ..., $504_P$. To obtain a maximum error for block 500, the maximum error count for each page $502_0$, $502_1$, ..., $502_P$ is determined ($maxFbc_0$, $maxFbc_1$, ..., $maxFbc_P$) of the codewords of each page $502_0$, $502_1$, ..., $502_P$, and the maximum error for the block is the maximum of the page maximum error counts, that is, the maximum of $maxFbc_0$, $maxFbc_1$, ..., $maxFbc_P$. To use average maximum error, the average of $maxFbc_0$, $maxFbc_1$, ..., $maxFbc_P$ is determined.

An example of code rate adaptation according to an embodiment of the present disclosure is described below, with reference to FIGS. 3 and 4. An initial code rate index is set at 0. A code rate test is run, resulting in a maximum error value of 60. Using the maximum error threshold value after applying the 50% margin, the lowest code rate index that can correct 60 errors is index 2, so at arrow 351, the code rate index is adjusted from 0 to 2. A second code rate test is run, resulting in a maximum error value of 40. Using the maximum error threshold value after applying the 50% margin, the lowest code rate index that can correct 40 errors is index 1, so at arrow 352, the code rate index is adjusted from 2 to 1. A third code rate test is run, resulting in a maximum error value of 120. Using the maximum error threshold value after applying the 50% margin, the lowest code rate index that can correct 120 errors is index 4, so at arrow 353, the code rate index is adjusted from 1 to 4. A fourth code rate test is run, resulting in a maximum error value of 210. Using the maximum error threshold value after applying the 50% margin, there is not a code rate index that can correct 210 errors, so at arrow 354, the block is marked as bad.

This type of progression with increasing and decreasing code rate indices, and more than incremental changes in code rate index, allows for the advantages of the embodiments of the present disclosure. Those advantages include increasing or decreasing ECC strength depending on changing error rates, using more accurate code rate adaptation statistics, and flexibility in adjustment. For example, in a case in which a block produces a large number of fail-bits but only temporarily, conventional code rate adaptation would increment to a next level of code rate index. This may not be sufficient to correct all errors, and an additional incremental adjustment or more may be needed in order to get to a proper code rate index. However, once the code rate index is changed to a stronger ECC, previous solutions do not allow weakening the ECC strength. Therefore, if the block reverts back to a lower fail-bit state, embodiments of the present disclosure have the advantage of reducing the strength of the ECC, allowing recovery of over provisioned regions that were not previously recoverable. Embodiments of the disclosure allow the bi-directional code rate adjustment to maintain over provisioning at its highest level for the current fail-bit count of a block.

Further, the ability in the embodiments of the present disclosure to adjust ECC strength by more than one increment at a time allows for faster code rate adaptation that is also more accurate. Conventional code rate adjustment allows only incremental increases in code rate index. If a block has a very high fail-bit count, several code rate adjustments would be used to reach the desired code rate. In contrast, the embodiments of the present disclosure move directly to the desired code rate faster by allowing more than an incremental increase in the code rate index.

Figure 6:
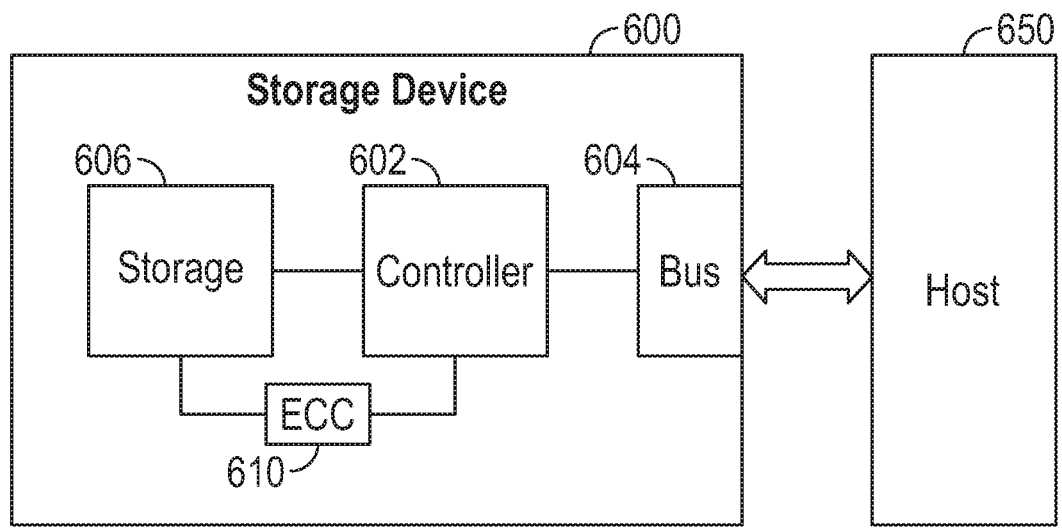
FIG. 6 is a block diagram of a data storage device on which embodiments of the present disclosure may be used.

Referring now to FIG. 6, a simplified block diagram of a storage system 600 on which embodiments of the present disclosure may be practiced is shown. Storage system 600 may be a solid state drive including non-volatile memory and associated controllers such as are known in the art; or any other storage system for persistent storage of information (e.g. a hybrid drive including solid-state storage elements and movable storage elements (e.g., data storage discs)). System 600 may include, by way of example, a controller 602 coupleable via a bus 604 or the like to a host system 650, where the host system 650 may provide power over the bus 604 or through a separate power bus (not shown), and a storage component 606 (such as nonvolatile memory). Code rate adaptation in the system 600 may be performed according to the methods described herein.

Figure 7:
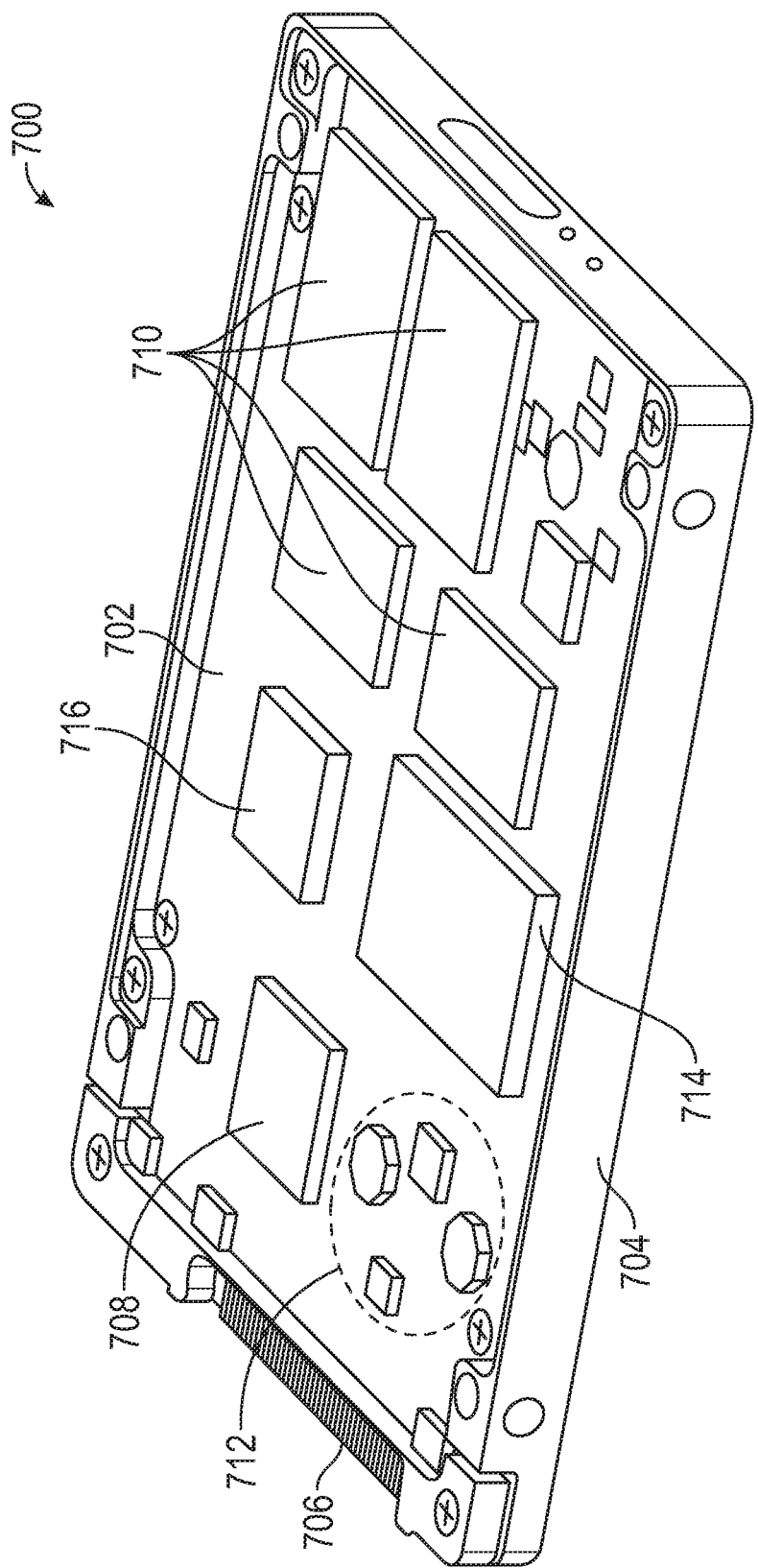
FIG. 7 is an oblique view of a solid state drive (SSD) on which embodiments of the present disclosure may be used.

FIG. 7 illustrates an oblique view of a solid state drive (SSD) 700 in accordance with a system embodying the methods described herein may be used. SSD 700 includes one or more printed circuit boards (PCBs) or circuit card assemblies 702 and typically includes a protective, supportive housing 704, and one or more interface connectors 706. SSD 700 further includes a controller application specific integrated circuit (ASIC) 708 or field programmable gate array (FPGS), one or more non-volatile memory devices 710, and power regulation circuitry 712. The memory devices 710 are essentially the SSD's data storage media. SSD 700 may include erasure blocks as the physical storage locations within memory device 710, which may include Flash memory devices, for example. In some applications, SSD 700 further includes a power-backup energy storage device, such as a super-capacitor 714.

In accordance with certain aspects, the SSD 700 includes the circuit card assembly 702 that includes a connector 706 for connection to a host computer (not shown). In accordance with certain aspects, the connector 706 includes a NVMe (non-volatile memory express), SCSI (small computer system interface), SAS (serial attached SCSI), FC-AL (fiber channel arbitrated loop), PCI-E (peripheral component interconnect express), IDE (integrated drive electronics), AT (advanced technology), ATA (advanced technology attachment), SATA (serial advanced technology attachment), IEEE (institute of electrical and electronics engineers)-1394, USB (universal serial bus) or other interface connector adapted for connection to a host computer. Code rate adaptation in the system 700 may be performed and code rate adaptation provided according to the methods described herein, with instructions stored on the controller 708, or in a separate memory controller for memory devices 710.

An error correction code apparatus according to an embodiment of the present disclosure includes an error correction code module, typically stored in the controller 708 or on a dedicated ECC circuit 610, 716 configured to encode and decode data using any of a plurality of error correction codes (ECCs) of different code rates, and to determine a fail-bit count of an ECC codeword within a block of a storage device 606, 710 of the apparatus. An ECC selection module, typically stored in the controller 708 or on the dedicated ECC circuit 610, 716, is configured to control selection of an ECC of the plurality of ECCs that has a weakest ECC that is sufficient to correct the determined fail-bit count.

The above-disclosed subject matter is to be considered illustrative, and not restrictive, and the appended claims are intended to cover all such modifications, enhancements, and other embodiments, which fall within the true scope of the present disclosure. Thus, to the maximum extent allowed by law, the scope of the present disclosure is to be determined by the broadest permissible interpretation of the following claims and their equivalents, and shall not be restricted or limited by the foregoing detailed description.

What is claimed is:

1. A method, comprising:
   programming data in a block of a storage device;
   reading back the programmed data and determining a maximum error count among codewords of the block;
   determining a code rate index that satisfies correction of the maximum error count for the block; and
   adjusting a current code rate index to the code rate index that satisfies correction of the maximum error count for the block comprising adjusting the current code rate index to a code rate index with less error correction than the current code rate index.

2. The method of claim 1, wherein determining a code rate index comprises using a table of correctable bit errors to select a code rate index for a weakest error correction code (ECC) strength that can correct the maximum error count.

3. The method of claim 2, wherein a correction margin is applied to each index in the table of correctable bit errors to compare to the maximum error count.

4. The method of claim 1, wherein adjusting the current code rate index comprises adjusting the current code rate index by more than one code rate index level.

5. The method of claim 1, wherein adjusting the current code rate index comprises adjusting the current code rate index in one step to a weakest error correction code that satisfies correction of the maximum error count for the block.

6. The method of claim 1, wherein determining a maximum error count for the block comprises:
   determining an error count for each codeword of each page of the block; and
   setting the maximum error count for the block to the largest error count for a codeword of the block.

7. The method of claim 1, wherein determining a maximum error count for the block comprises:
   determining an error count for each codeword of each page of the block; and
   setting the maximum error count for the block to an average of the largest codeword of each page of the block.

8. The method of claim 1, and further comprising:
   when the maximum error count for the block exceeds a maximum correctable error count for the block, marking the block as a bad block.

9. The method of claim 1, wherein determining a maximum error count for the block comprises inferring a maximum error count from a syndrome weight based on totaiin a number of non-zero error coacting code equations used in decoding when the decoding is not successful.

10. The method of claim 1, wherein determining a maximum error count for the block comprises:
    placing data to be written to the block into a write buffer of the storage device;
    writing the data to the block;
    reading the data back from the block; and
    comparing the data read from the block and the data in the write buffer.

11. An apparatus, comprising:
    an error correction code element configured to encode and decode data using any of a plurality of error correction codes (ECCs) of different code rates, and to determine a fail-bit count of an ECC codeword within a block of a storage device of the apparatus; and
    an ECC selection element configured to adjust a current ECC of the plurality of ECCs to a one of the ECCs that is sufficient to correct a number of bit errors closest to but greater than the determined fail-bit count and has less error correction than the current ECC.

12. The apparatus of claim 11, wherein the ECC selection element determines the weakest ECC that is sufficient to correct the determined fail-bit count using a code rate index table of correctable bit errors.

13. An apparatus, comprising:
    a controller;
    a storage device coupled to the controller; and
    a code rate adaptation module configured to adjust error correction for the storage device;
    the controller configured to:
      program data in a block of a storage device; and
      read back the programmed data and obtain a maximum error count among codewords of the block; and
    the code rate adaptation module configured to:
      determine a code rate index that satisfies correction of the maximum error count for the block; and
      adjust a current code rate index to the code rate index that satisfies correction of the maximum error count for the block by adjusting the current code rate index to a code rate index with less error correction than the current code rate index.

14. The apparatus of claim 13, wherein determining a code rate index comprises using a table of correctable bit errors to select a code rate index for a weakest error correction code (ECC) strength that can correct the maximum error count.

15. The method of claim 14, wherein a correction margin is applied to each index in the table of correctable bit errors to compare to the maximum error count.

16. The method of claim 13, wherein adjusting the current code rate index comprises adjusting the current code rate index by more than one code rate index level.

17. The method of claim 13, wherein determining a maximum error count for the block comprises:
    determining an error count for each codeword of each page of the block; and
    setting the maximum error count for the block to the largest error count for a codeword of the block.

18. The method of claim 13, wherein determining a maximum error count for the block comprises:
    determining an error count for each codeword of each page of the block; and
    setting the maximum error count for the block to an average of the largest codeword of each page of the block.

19. The method of claim 1, wherein:
    the current code rate index has an associated threshold of correctable bit errors; and
    the code rate index that satisfies correction of the maximum error count for the block has an associated threshold of correctable bit errors that is less than the threshold of correctable bit errors associated with the current code rate index, and greater than the maximum error count.

20. The apparatus of claim 13, wherein:

the current code rate index has an associated threshold of correctable bit errors; and the code rate index that satisfies correction of the maximum error count for the block has an associated threshold of correctable bit errors that is less than the threshold of correctable bit errors associated with the current code rate index, and greater than the maximum error count.

\* \* \* \* \*

UNITED STATES PATENT AND TRADEMARK OFFICE
CERTIFICATE OF CORRECTION

| | |
|---|---|
| PATENT NO. | : 11,133,831 B2 |
| APPLICATION NO. | : 16/667491 |
| DATED | : September 28, 2021 |
| INVENTOR(S) | : Shuhei Tanakamaru et al. |

Page 1 of 1

It is certified that error appears in the above-identified patent and that said Letters Patent is hereby corrected as shown below:

In the Claims

Column 7, Claim 9, Line 60, please replace the word "totaiin" with the word --totaling--.

Column 7, Claim 9, Line 61, please replace the word "coacting" with the word --correcting--.

Signed and Sealed this
Ninth Day of November, 2021

Drew Hirshfeld
*Performing the Functions and Duties of the*
*Under Secretary of Commerce for Intellectual Property and*
*Director of the United States Patent and Trademark Office*